(12) United States Patent
Hasegawa

(10) Patent No.: US 6,169,449 B1
(45) Date of Patent: Jan. 2, 2001

(54) TRANSMISSION POWER CONTROL CIRCUIT CAPABLE OF VARYING ELECTRIC POWER OVER A WIDE RANGE

(75) Inventor: Osamu Hasegawa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/345,030

(22) Filed: Jul. 2, 1999

(30) Foreign Application Priority Data

Jul. 3, 1998 (JP) .................................................. 10-188738

(51) Int. Cl.[7] ...................................................... H03F 3/60
(52) U.S. Cl. ................................ 330/51; 330/53; 330/151
(58) Field of Search ........................... 330/51, 53, 124 R, 330/151; 333/1.1

(56) References Cited

U.S. PATENT DOCUMENTS

| | | | |
|---|---|---|---|
| 3,992,669 | 11/1976 | Dades | 330/124 D X |
| 4,056,785 | 11/1977 | Swan | 330/53 |
| 4,305,043 | 12/1981 | Ho et al. | 330/53 |
| 4,910,478 | 3/1990 | Koyama | 330/278 |
| 5,909,643 | * 6/1999 | Aihara | 330/51 X |

FOREIGN PATENT DOCUMENTS

| | | |
|---|---|---|
| 0 735 668 A1 | 10/1996 | (EP) . |
| 5-83041 | 4/1993 | (JP) . |
| 7-336243 | 12/1995 | (JP) . |
| 8-222963 | 8/1996 | (JP) . |

* cited by examiner

Primary Examiner—Steven J. Mottola
(74) Attorney, Agent, or Firm—Scully, Scott, Murphy & Presser

(57) ABSTRACT

In a transmission power control circuit having a power amplifier, a bypass circuit is selectively switched from the power amplifier on low power transmission by the use of first and second switches and a circulator which has three ports. When the bypass circuit is connected to one port of the circulator through the first and the second switches, a signal which is not amplified by the power amplifier is circulated to a remaining port of the circulator for connection of the power amplifier and is reflected at the remaining port to be sent to an output port of the circulator without attenuation. On connection of the bypass circuit, the power amplifier is turned off to reduce current consumption therein.

23 Claims, 6 Drawing Sheets

US 6,169,449 B1

TRANSMISSION POWER CONTROL CIRCUIT CAPABLE OF VARYING ELECTRIC POWER OVER A WIDE RANGE

BACKGROUND OF THE INVENTION

This invention relates to a transmission power control circuit for use in a transmitter and, in particular, to a transmission power control circuit which is included in a transmitter used in a code division multiple access (CDMA) system.

Heretofore, proposal has been made in Japanese Unexamined Patent Publication Nos. Hei 7- 336243 (namely, 336243/1995), Hei 8-222963 (namely, 222963/1996), and Hei 5-83041 (namely, 83041/1993) about a wide variety of transmission power control circuits which can be used in a CDMA system which has a base station and a plurality of mobile stations communicable with the base station. This is because transmission power is controlled in each mobile station of the CDMA system in response to a control signal sent from a base station. To this end, the transmission power control circuit is usually included in the transmitter of each mobile station and must cope with a variation over a very wide range, such as 70 dB.

More specifically, the transmission power control circuit disclosed in Hei 5-83041 (will be simply referred to as Reference) mentioned above has a power amplifier circuit which includes a FET as an amplifying element and a gate bias circuit for controlling a gate bias of the FET. With this structure, it is possible to reduce electric power on low power transmission not only by control a drain bias of the FET but also by varying the gate bias of the FET. In this event, electric power consumption can be decreased by reducing an electric current caused to flow through the FET on the low power transmission within a predetermined output range.

However, it is to be noted that such a reduction of the electric power consumption can be established only within the predetermined output range. In other words, such a power reduction can not be realized when an output level becomes lower than the predetermined output range. This is because the power amplifier which includes the FET must keep a linear characteristic and can not reduce an idle current to zero on the low power transmission.

SUMMARY OF THE INVENTION

It is an object of this invention to provide a transmission power control circuit which is capable of controlling transmission power over a very wide range.

It is another object of this invention to provide a transmission power control circuit of the type described, which can be effectively used in a CDMA system.

It is still another object of this invention to provide a method of controlling transmission power over a very wide range by using a circulator.

A transmission power control circuit to which this invention is applicable has a circuit input terminal and a circuit output terminal. According to this invention, the transmission power control circuit comprises a first transmission circuit which has a first input terminal and a first output terminal, a second transmission circuit which has a second input terminal and a second output terminal, a circulator which has a first circulator port connected to the first output terminal, a second circulator port connected to the circuit output terminal, and a third circulator port selectively connected to the second output terminal and which circularly transmits an electric signal from a selected one of the second and the third circulator ports to the first circulator port, and a switch circuit which selectively connects the circuit input terminal to the first and the second transmission circuits to selectively supply the electric signal to the first and the third circulator ports.

In operation, the first transmission circuit has an output impedance and the electric signal is sent from the third circulator port to the second circulator port through the first circulator port in dependency upon the output impedance when the switch circuit selects the second transmission circuit to supply the electric signal to the third circulator port through the second transmission circuit.

Herein, the first transmission circuit may include a power amplifier for amplifying the electric signal while the second transmission circuit may include a bypass circuit which does not amplify the electric signal. In this event, it is possible to vary a gain of the transmission power control circuit over a wide range by selecting the power amplifier and the bypass circuit. Moreover, the circulator serves to avoid attenuation of the electric signal sent from the bypass circuit.

DESCRIPTION OF THE PREFERRED EMBODIMENTS

Figure 1:
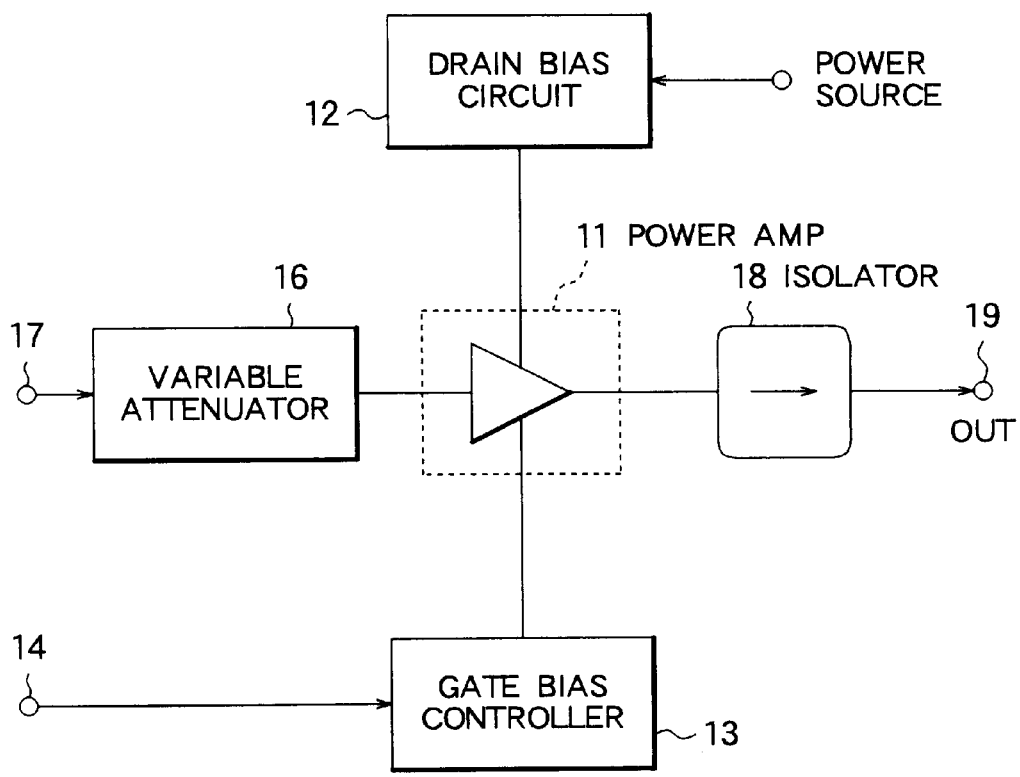
FIG. 1 is a block diagram for use in schematically describing a conventional transmission power control circuit.

Referring to FIG. 1, description will be made about a conventional transmission power control circuit which is substantially equivalent to that shown in Reference cited in the preamble of the instant specification. In FIG. 1, the conventional transmission power control circuit comprises a power amplifier 11 which has an amplifier input terminal and an amplifier output terminal and which includes at least one field effect transistor (FET) (not shown) as an amplifying element. As known in the art, the FET has a drain electrode, a source electrode, and a gate electrode. The drain electrode of the FET is connected through a drain bias circuit 12 to a power source (not shown) while the gate electrode of the FET is connected to a gate bias controller 13 which has a gate control terminal 14 given a gate control voltage from a controller (not shown).

On the other hand, the amplifier input terminal is connected to a variable attenuator 16 through a circuit input terminal 17 to which an input transmission signal is given. With this structure, the input transmission signal is delivered to the power amplifier 11 after it is adjusted in level by the attenuator 16. The power amplifier 12 can be selectively put into an on state or an off state by switching a source voltage sent from the power source by the drain bias circuit 12 connected to the drain electrode of the FET. Moreover, the gate electrode of the FET included in the power amplifier 11 is controlled by the gate bias controller 13 connected to the gate control terminal 14.

In the illustrated transmission power control circuit, the gate bias voltage of the gate electrode in the FET is varied in response to the gate control signal to change the output power of an output transmission signal over a predetermined range while the power amplifier 11 is turned on. The output transmission signal controlled by the gate bias controller 13 is sent from the power amplifier 11 through an isolator 18 to a circuit output terminal 19 as an output signal OUT.

In the above-mentioned structure, it is possible to reduce power consumption during a low output state by restricting a drain current by the gate control voltage. However, the transmission power control circuit illustrated in FIG. 1 is disadvantageous in that restricting the drain current is limited to the predetermined range because the power amplifier 11 must be put into an operated state, even when the power amplifier 11 is operated in the low output state, as mentioned before.

Figure 2:
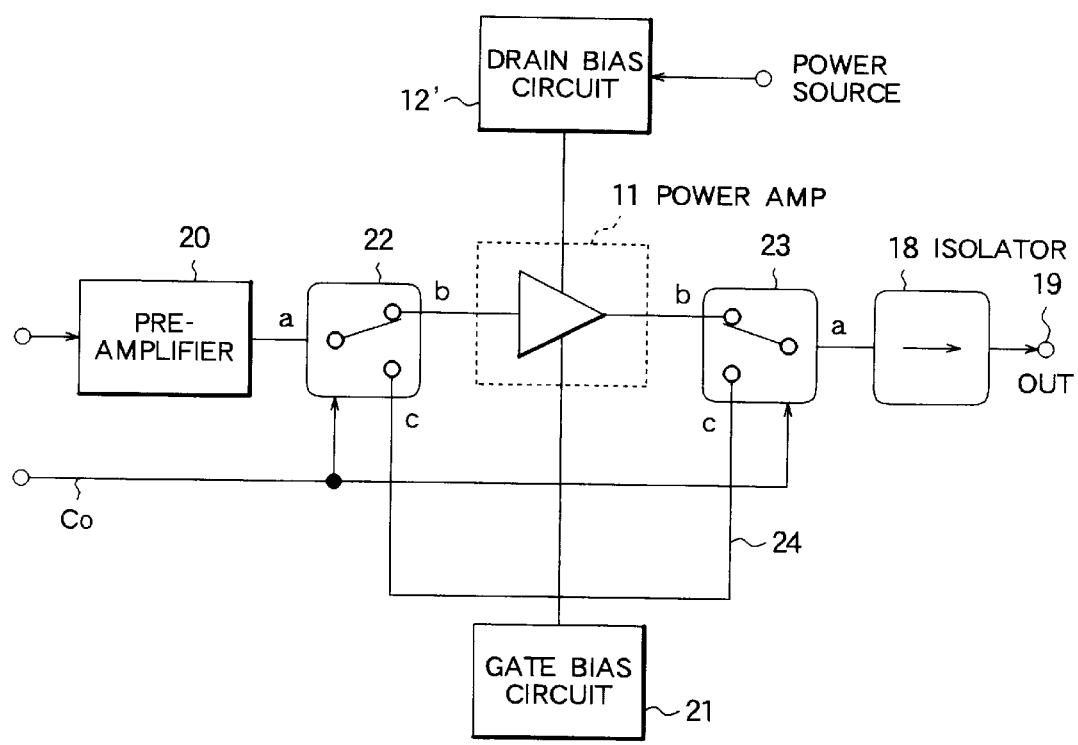
FIG. 2 is a block diagram for use in describing a transmission power control circuit to which this invention is applicable.

Referring to FIG. 2, a transmission power control circuit to which this invention is applicable has a preamplifier 20 located before the power amplifier 11 and an isolator 18 connected to the circuit output terminal 19 like in FIG. 1. In addition, the illustrated power amplifier 11 is assumed to have an FET like in FIG. 1 and comprises a drain bias circuit 12' connected to the drain electrode of the FET and a gate bias circuit 21 connected to the gate electrode of the FET.

As shown in FIG. 2, the illustrated transmission power control circuit has a first switch 22 between the preamplifier 20 and the power amplifier 11 and a second switch 23 between the power amplifier 11 and the isolator 18. Each of the first and the second switches 22 and 23 has a changeover port a, a first switch port b, and a second switch port c. A bypass circuit 24 is connected between the second switch ports c of the first and the second switches 22 and 23 while the first switch ports b of the first and the second switches 22 and 23 are connected to an amplifier input terminal and an amplifier output terminal of the power amplifier 11.

Each of the first and the second switches 22 and 23 is switched in response to a control signal Co to selectively connect the changeover port a to the first switch port b or the second switch port c. The control signal Co is given from a controller (not shown) to each of the first and the second switches 22 and 23.

In the illustrated example, when the transmission power control circuit is operated at a high power level, the changeover ports of the first and the second switches 22 and 23 are connected to the first switch ports b, as shown in FIG. 2. As a result, the preamplifier 20 is connected to the power amplifier through the first switch 22 and the power amplifier 11 is connected to the isolator 18 through the second switch 23. Therefore, a transmission input signal which is given to the preamplifier 20 is amplified by both the preamplifier 20 and the power amplifier 23 into the output signal of the high power level which is sent through the isolator 18 and the circuit output terminal 19.

On the other hand, when the illustrated transmission power control circuit is operated at a low power level, the first and the second switches 22 and 23 are switched from the first switch ports b to the second switch ports c. As a result, the preamplifier 20 is connected to the bypass circuit 24 through the first switch 22 and is also connected to the isolator 18 through the second switch 23. Thus, an output signal amplified by the preamplifier 20 is given as the output signal OUT through the circuit output terminal 19 without being amplified by the power amplifier 11. This shows that the power amplifier 11 is bypassed by the bypass circuit 24 and may be kept inactive under control of the drain bias circuit 12', like in FIG. 1.

With this structure, it is possible to reduce power consumption in the power amplifier 11 because the output signal of the preamplifier 20 is directly sent through the circuit output terminal 19 as the circuit output signal.

However, the transmission power control circuit indispensably causes a power loss to occur at the second switch 23 when the power amplifier 11 is kept active.

Figure 3:
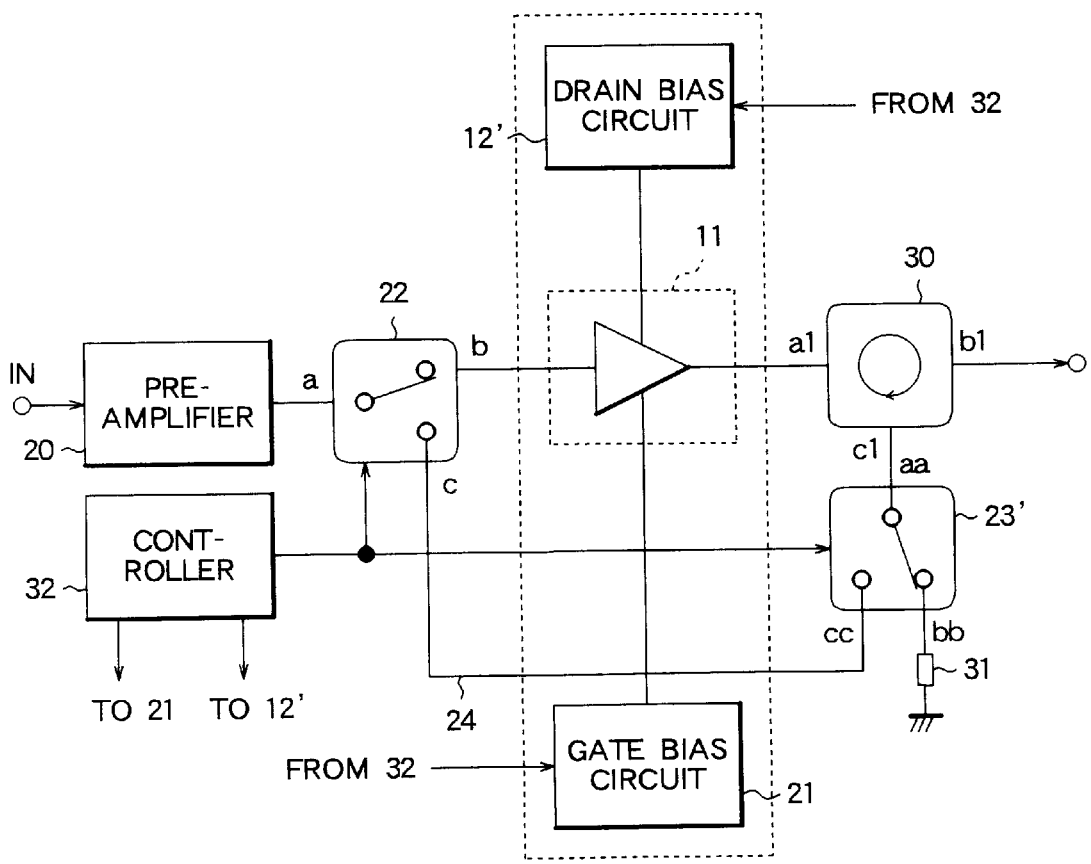
FIG. 3 is a schematic block diagram for use in describing a transmission power control circuit according to a first embodiment of this invention.

Referring to FIG. 3, a transmission power control circuit according to a first embodiment of this invention comprises similar parts designated by like reference numerals and symbols in FIG. 2. More specifically, the illustrated transmission power control circuit has the circuit input terminal (depicted by IN), the circuit output terminal (depicted by OUT), the preamplifier 20 connected to the circuit input terminal IN, the first switch 22, the drain bias circuit 12', and the gate bias circuit 21, like in FIG. 2. The power amplifier 11, the drain bias circuit 12', and the gate bias circuit 21 may be considered as being equivalent to those illustrated in FIG. 2 and may be collectively called a power amplification circuit 25.

In the illustrated example, the power amplifier 11 has an amplifier input terminal and an amplifier output terminal. For convenience of description, the power amplifier 11 will be called a first transmission circuit while the amplifier input terminal and the amplifier output terminal may be called a first input terminal and a first output terminal, respectively. Likewise, the bypass circuit 24 will be called a second transmission circuit which has a second input terminal and a second output terminal connected to the first and the second switches 22 and 23' in the illustrated manner.

In the illustrated example, the first switch 22 is connected between the preamplifier 20 and the amplifier input terminal or the first input terminal of the power amplifier 11. On the other hand, a circulator 30 is connected between the amplifier output terminal or the first output terminal of the power amplifier 11 and the circuit output terminal OUT. Specifically, the illustrated circulator 30 has a first circulator port a1 connected to the amplifier output terminal of the power amplifier 11, a second circulator port b1 connected to the circuit output terminal OUT, and a third circulator port c1 connected to a second switch 23' which has a changeover port aa, a first switch port bb, and a second port cc.

As shown in FIG. 3, the changeover port aa of the second switch 23' is connected to the third circulator port cl of the circulator 30 while the first port bb of the second switch 23' is connected to a terminator 31 which has an impedance determined in relation to a characteristic impedance of a transmission path including the power amplifier 11. Like in FIG. 2, the second port cc of the second switch 23' is connected to the second port c of the first switch 22 through the bypass circuit 24. The first and the second switches 22 and 23' may be collectively referred to as a selection circuit which selectively connects the circuit input terminal IN to the power amplifier 11 and the bypass circuit 24 to selectively supply the electric signal to the circuit output terminal OUT.

In addition, the illustrated transmission power control circuit further comprises a controller 32 connected to the first and the second switches 22 and 23'. The illustrated controller 32 is also connected to the drain bias circuit 12' and the gate bias circuit 21 to control the drain electrode and the gate electrode of the FET included in the power amplifier 11.

In FIG. 3, it is to be noted that the circulator 30 serves to circulate an electric signal from the third circulator port c1 to the first circulator port a1, from the first circulator port a1 to the second circulator port b1, and from the second circulator port b1 to the third circulator port c1.

Now, description will be made about operation of the illustrated transmission power control circuit.

Herein, let the controller 32 detect that a reception or an input signal has a transmission level higher than a predetermined level. Furthermore, it is assumed that the controller 32 delivers a switch control signal to the first and the second switches 22 and 23' to connect the changeover ports a and aa of the first and the second switches 22 and 23' to the first ports b and bb. Consequently, the first port b of the first switch 22 is connected to the power amplifier 11 while the first port bb of the second switch 23' is connected to the terminator 31. Under the circumstances, both the drain bias circuit 12' and the gate bias circuit 21 become active and, as a result, the power amplifier 11 is put into the active state. In this event, the transmission input signal which is given through the circuit input terminal IN is delivered to the preamplifier 20 and is preliminarily amplified into a pre-amplified signal. The pre-amplified signal is supplied through the first switch 22 to the power amplification circuit 25 and is amplified into an amplified signal to be sent to the first circulator port a1 of the circulator 30.

The amplified signal supplied to the first circulator port a1 of the circulator 30 is circulated to the second circulator port b1 of the circulator 30 and is produced as the output signal through the circuit output terminal OUT.

Let the controller 32 detect that the reception signal has a level which is not higher than the predetermined level. In this case, both the drain bias circuit 12' and the gate bias circuit 21 are put into inactive states and, as a result, the power amplifier 11 becomes inactive. Furthermore, it is surmised that the controller 32 sends the switch control signal to the first and the second switches 22 and 23' to connect the changeover ports a and aa of the first and the second switches 22 and 23' to the second ports c and cc. Thus, the preamplifier 20 is connected to the circulator 30 through the first switch 22, the bypass circuit 24, and the second switch 23'.

In this case, the pre-amplified signal which is amplified by the preamplifier 20 is sent to the circulator 30 through the first switch port c of the first switch 22, the bypass circuit 24, the second switch port cc, and the changeover port aa, and the third circulator port c1 of the circulator 30. Thus, the pre-amplified signal is supplied to the circulator 30 through the bypass circuit 24 without being amplified by the power amplification circuit 25 and may be called a non-amplified signal. The non-amplified signal supplied to the third port c1 of the circulator 30 is circulated from the third circulator port c1 to the second circulator port b1 of the circulator 30 and is threreafter circulated from the first circulator port a1 to the second circulator port b1 to be produced as the output signal through the circuit output terminal OUT.

When the non-amplified signal is circulated from the third circulator port c1 to the first circulator port a1, the power amplification circuit 25 is put into the inactive state, as mentioned above. This means that an output impedance of the power amplification circuit 25 is extremely high and a voltage standing wave ratio (VSWR) becomes large at the first circulator port a1 of the circulator 30. As a result, the non-amplified signal is substantially subjected to reflection at the first circulator port a1 of the circulator 30 and is circulated to the second circulator port b1 of the circulator 30 without being attenuated at the first circulator port a1. Therefore, the non-amplified signal is transmitted to the circuit output terminal OUT without any loss.

Figure 4:
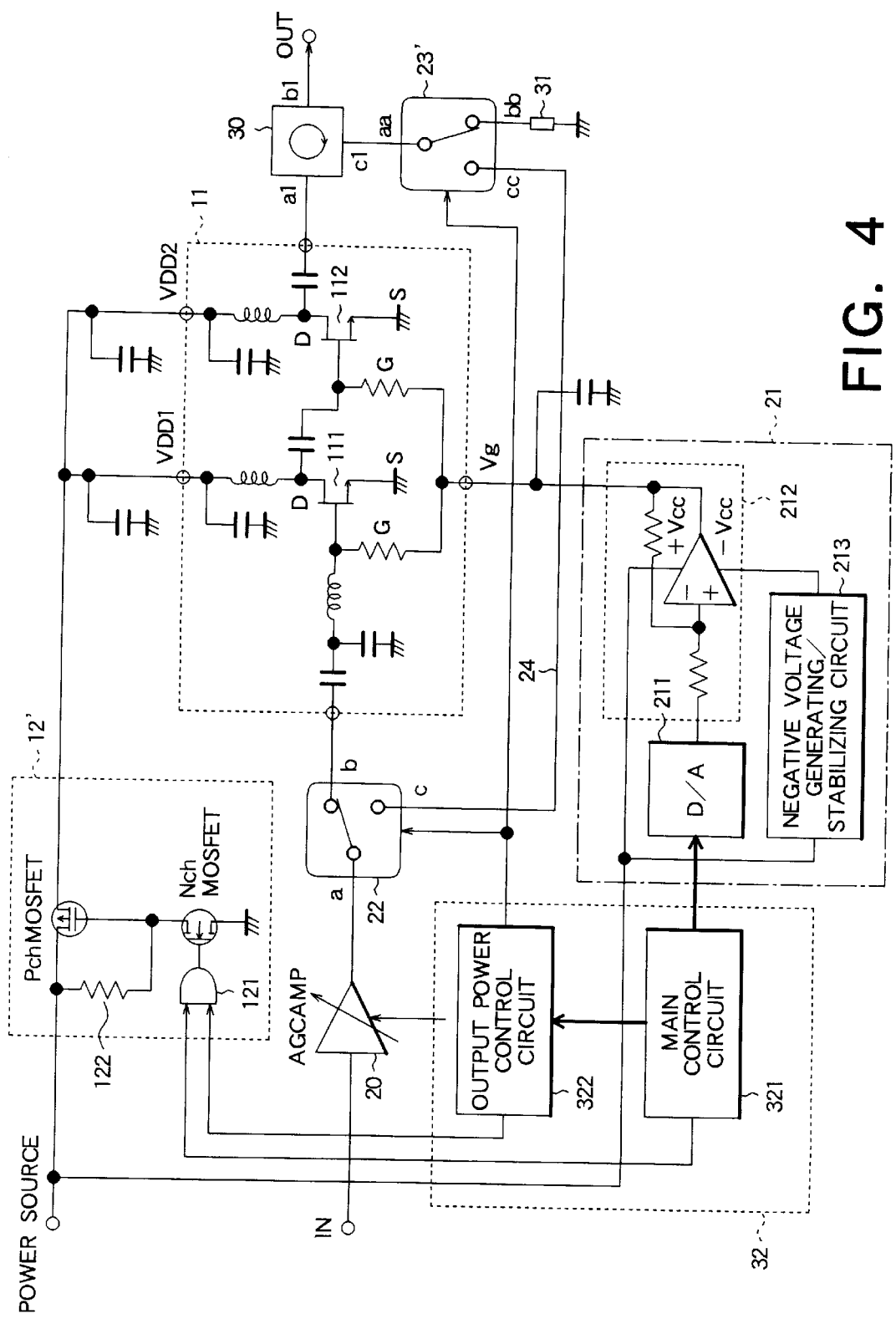
FIG. 4 is a specific block diagram of the transmission power control circuit illustrated in FIG. 3.

Referring to FIG. 4 together with FIG. 3, the transmission power control circuit comprises an automatic gain control (AGC) amplifier as the preamplifier 20. The AGC amplifier 20 is controlled by the controller 32 which has a main control circuit 321 formed by a CPU and an output power control circuit 322 connected to the AGC amplifier 20. The illustrated output power control circuit 322 also controls the first and the second switches 22 and 23' and the drain bias circuit 12' under control of the main control circuit 321. On the other hand, the main control circuit 321 is coupled to the drain bias circuit 12' and the gate bias circuit 21.

In FIG. 4, the drain bias circuit 12' includes an AND gate 121, N-channel MOS FET, P-channel MOS FET, and a pull-up resistor 122 all of which are connected in a manner shown in FIG. 4. The AND gate 121 is connected to both the main control circuit 321 and the output power control circuit 322 which are mentioned before.

Furthermore, the gate bias circuit 21 illustrated in FIG. 4 comprises a digital-to-analog (D/A) converter 211, an inverting amplifier 212, and a negative voltage generating/stabilizing circuit 213 which may be structured by a DC—DC converter. As shown in FIG. 4, the D/A converter 211 is connected to the main control circuit 321 while the inverting amplifier 212 is located between the D/A converter 211 and the drain bias circuit 12'. The DC—DC converter 213 is connected to the power source and is also connected to the inverting amplifier 212. The illustrated inverting amplifier 212 is structured by an operational amplifier.

The main control circuit 321 sends a logic "1" signal as a main control signal to the drain bias circuit 12' at the beginning of transmission to turn the same into an on-state on one hand and indicates a transmission level to the output power control circuit 322 on the other hand. Responsive to the transmission level, the output power control circuit 322 compares the transmission level with a threshold level.

In addition, the output power control circuit 322 supplies the AGC amplifier 20 with an AGC voltage which corresponds to the transmission level. Moreover, the main control circuit 321 supplies the D/A converter 211 with a digital data signal representative of the transmission level. The digital data signal is converted by the D/A converter 211 into an analog signal corresponding to the transmission level and is sent to the inverting amplifier 212. As shown in FIG. 4, the inverting amplifier 212 is given a positive source voltage +Vcc and a negative source voltage obtained by adding, to -Vcc, a negative voltage given by the DC—DC converter 213. With this structure, a negative output voltage can be generated by the inverting amplifier 212.

In FIG. 4, it is assumed that the output power control circuit 322 detects that the transmission level is lower than the threshold level. Under the circumstances, the output power control circuit 322 delivers the switch control signal to the first and the second switches 22 and 23' to bypass the power amplifier 11 by connecting the first and the second switches 22 and 23' to the bypass circuit 24. In this event, the output power control circuit 322 sends a logic "0" signal as an off signal to the drain bias circuit 12'. As a result, the AND gate 121 of the drain bias circuit 12' produces the logic "0" signal to put the drain bias circuit 12' into the inactive state.

In this situation, the reception signal is given as a transmission input signal through the circuit input terminal IN and is amplified by the AGC amplifier 20 to the transmission level. The amplified signal is thereafter sent through the bypass circuit 24 to the circulator 30 when the output power control circuit 322 detects that the transmission level is lower the threshold level.

On the other hand, when the transmission level is not lower than the threshold level, the output power control circuit 322 delivers the first and the second switches 22 and 23' to the switch control signal. In this case, the power amplifier 11 and the terminator 31 are connected to the AGC amplifier 20 and the circulator 30 through the first and the second switches 22 and 23', respectively.

Moreover, the output power control circuit 322 supplies the logic "1" signal as an on signal to the AND gate 121, with the logic "1" level signal given from the main control circuit 321 to the AND gate 121. This makes the AND gate 121 produce the logic "1" level signal. Under the circumstances, the drain bias circuit 12' is put into the active state and, as a result, the source voltages VDD1 and VDD2 are given from the power source to the power amplifier 11 through the drain bias circuit 12'. Likewise, the gate bias circuit 21 is also put in an active state.

More specifically, the logic "1" level signal is produced by the AND gate 121 of the drain bias circuit 12'. In this case, the N-channel MOS PET is turned into an on state and the P-channel MOS PET is also turned into an on state. In consequence, the power source is electrically connected to the power amplifier 11 through the P-channel MOS FET to supply the source voltage VDD1 and VDD2 to the power amplifier 11.

On the other hand, when the AND gate 121 is turned off, the N-channel MOS FET is put into the off state. Since the gate electrode of the P-channel MOS FET is pulled up by the pull-up resistor 122, the P-channel MOS FET is also put into the off state. No source voltage is given to the power amplifier 11.

The illustrated power amplifier 11 includes first and second FETs 111 and 112 each of which has a drain electrode D, a source electrode S, and a gate electrode G. Both the drain electrodes D of the first and the second FETs 111 and 112 are supplied with source voltages VDD1 and VDD2 from the drain bias circuit 12' through coils while both the source electrodes S are grounded. The gate electrode G of the first FET 111 is coupled to the first switch 22 while the gate electrode G of the second FET 112 is coupled to the drain electrode D of the first FET 111. The drain electrode of the second FET 112 is coupled to the circulator 30 through a capacitor and the amplifier output terminal.

When the power amplifier 11 is not bypassed by the first switch 22, the gate bias circuit 21 supplies the gate bias voltage Vg to the gate electrodes of the first and the second FETs 111 and 112 through resistors. The gate bias circuit 21 makes it possible to set the gate voltages of the first and the second FETs 111 and 112 into optimum levels in accordance with the transmission level. In other words, the consumption current can be determined by the gate bias circuit 21 very efficiently with linearity kept.

Herein, it is to be noted that the transmission power control circuit illustrated in FIG. 4 can supply the pre-amplified signal to the third circulator port c1 of the circulator 30 through the bypass circuit 24 and the second switch port cc of the second switch 23' when the transmission level is lower than the threshold level, as described before. In other words, the pre-amplified signal is delivered to the circulator 30 without being amplified by the power amplifier 11 and may be called a non-amplified signal. The non-amplified signal is circulated from the third circulator port c1 to the first circulator port a1 of the circulator 30 and is totally reflected at the first circulator port a1 because the power amplifier 11 is put into the inactive state. Subsequently, the reflected signal is sent from the first circulator port a1 to the second circulator port b1 of the circulator 30 and is produced as the output transmission signal through the circuit output terminal OUT.

At any rate, the illustrated transmission power control circuit can bypass a transmission path including the power amplifier 30 at a low transmission level by using the first and the second switches 22 and 23' to switch the transmission path to another transmission path which includes no power amplifier. While the power amplifier 30 is bypassed by the first and the second switches 22 and 23', the power amplifier 30 is kept in the inactive state or an off state under control of the controller 32. Such an off state of the power amplifier 30 is helpful to increase the VSWR at the first circulator port a1 of the circulator 30 at which the power amplifier 11 is connected. Accordingly, it is possible to reduce power consumption at the low transmission level and to avoid attenuation of the non-amplified signal.

Figure 5:
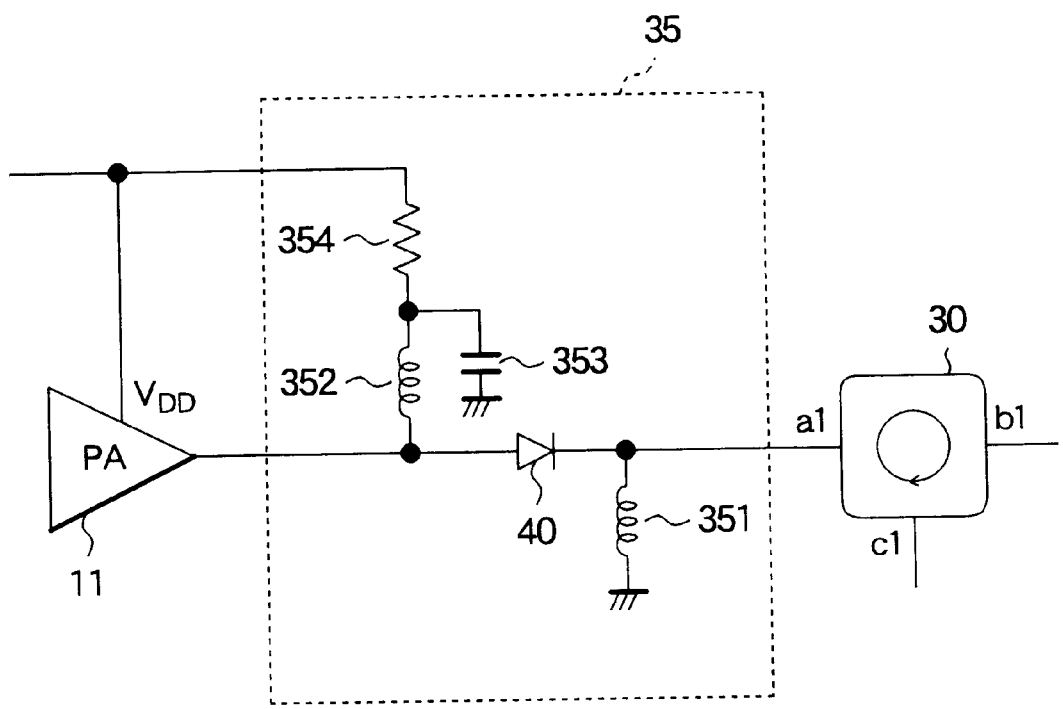
FIG. 5 is a partial block diagram for use in describing a transmission power control circuit according to a second embodiment of this invention.

Referring to FIG. 5, a transmission power control circuit according to a second embodiment of this invention comprises an intermediate circuit 35 between the power amplifier (PA) 11 and the circulator 30 both of which are similar to those illustrated in FIGS. 3 and 4. The intermediate circuit 35 may be included in the power amplification circuit and is specified by a diode 40 which has an anode connected to the power amplifier 11 and a cathode connected to the first circulator port a1 of the circulator 30. Thus, the diode 40 is connected in an inverse direction with respect to the circulator 30.

The illustrated intermediate circuit 35 has choke coils 351 and 352 connected to the anode and the cathode of the diode 40, respectively, a capacitor 353 connected between the choke coil 352 and the ground, and a resistor 354 connected to the choke coil 352 in series.

Preferably, the diode 40 may be, for example, a PIN diode. In any event, the first circulator port a1 of the circulator 30 is substantially put into an open state when the power amplifier 11 is bypassed in the manner mentioned before and is seen from the circulator 30. This structure can completely reflect the non-amplified signal given to the first circulator port a1 from the third circulator port c1. Thus, the non-amplified signal can be circulated or transmitted from the first circulator port a1 to the second circulator port b1 without a substantial loss.

Figure 6:
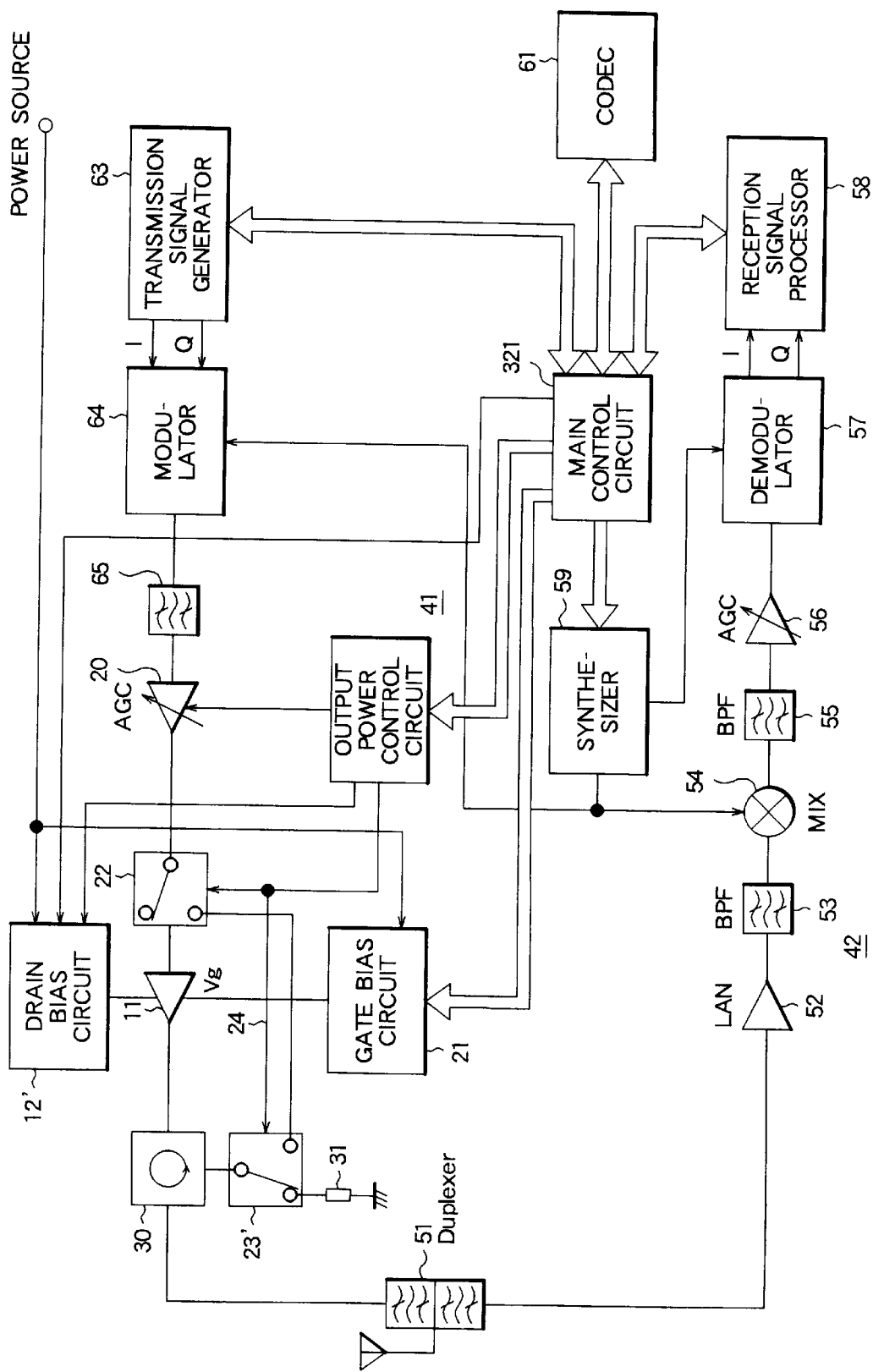
FIG. 6 is a block diagram for use in describing a mobile station which includes the transmission power control circuit according to this invention.

Referring to FIG. 6, description will be made about a mobile station which includes the transmission power control circuit illustrated in FIG. 3 or 4 and which comprises a transmitter section 41 and a receiver section 42. As shown in FIG. 5, the transmission power control circuit is included in the transmitter section 41 and comprises similar parts designated by like reference numerals and symbols, like in FIG. 3 or 4. Therefore, description will be mainly made about the receiver section 42. The illustrated receiver section 42 is coupled to an antenna through a duplexer 51 used in common to the transmitter section 41, a low noise amplifier (LNA) 52, a band-pass filter 53, a mixer 54, another band-pass filter 55, an AGC amplifier 56, a demodulator 57, and a reception signal processor 58.

In addition, the demodulator 57 is coupled to a synthesizer 59 controlled by the main control circuit 321 and supplies the signal processor 58 with a demodulated signal which includes an in-phase component (I) and a quadrature component (Q). The in-phase and the quadrature components (I) and (Q) are processed by the reception signal processor 58 into a sequence of reception decoded signals under control of the main control circuit 321. As shown in FIG. 6, the main control circuit 321 is coupled to a codec 61 which generates a succession of codes which are used for the CDMA system and makes the signal processor 58 decode the in-phase and the quadrature components (I) and (Q) in to the reception decoded signals by the use of the codes.

Similar operation is carried out in connection with a control signal sent from a base station (not shown). As a result, the control signal is given to the main control circuit 321. Supplied with the control signal from the base station, the main control circuit 321 indicates the transmission level of the output power control circuit 322 and supplies the gate bias circuit 21 with the digital signal corresponding to the transmission level.

In the illustrated transmitter section 41, a transmission signal generator 63 is also included to generate in-phase and quadrature transmission components (I) and (Q) under control of the main control circuit 321 coupled to the codec 61. At any rate, the transmission signal is coded by the codec 61 into each of the in-phase and the quadrature transmission components (I) and (Q) which is sent from the transmission signal generator 63 in the form of a sequence of digital signals. The in-phase and the quadrature transmission components (I) and (Q) are given to a modulator 64 which is coupled to the synthesizer 59 and which may execute quadrature modulation, such as quadrature phase shift keying, quadrature amplitude modulation, to deliver the transmission signal to the AGC amplifier 20 through a band-pass filter 65.

The AGC amplifier 20 produces the pre-amplified signal in the manner mentioned in conjunction with FIG. 4. The pre-amplified signal is selectively supplied through the power amplifier 11 to the circulator 30 or through the bypass circuit 24 to the circulator 30, as mentioned before. Thus, the pre-amplified signal is directly transmitted through the antenna without being amplified by the power amplifier 11 when the power amplifier 11 is bypassed. On the other hand, the illustrated power amplifier 11 itself can also vary output power over a wide range by controlling the drain bias circuit 12' and the gate bias circuit 21. Accordingly, the transmitter section 41 illustrated in FIG. 6 can control the transmission power over a very wide range. In any event, a transmission output signal is transmitted to the base station in the form of a radio signal through the circulator 30, the duplexer 51, and the antenna.

In FIG. 6, the synthesizer 59 serves to deliver a local oscillation signal and any other oscillation signals to the mixer 54, the demodulator 57, and the modulator 64.

While this invention has thus far been described in a few embodiments thereof, it will readily be possible for those skilled in the art to put this invention into practice in various other manners. For example, the power amplifier 11 may not always have an infinite output impedance when it is bypassed by the bypass circuit 24 but may have a finite output impedance. With this structure, a phase of the pre-amplified signal can be controlled at the first circulator port a1 of the circulator 30 by using the reflection from the power amplifier 11. Although the illustrated bypass circuit 24 has been specified by a short-circuit, it may have any impedance. In addition, the transmission power control circuit according to this invention may be used in a base station.

At any rate, the transmission power control circuit according to this invention is advantageous in that current consumption can be remarkably reduced in the transmitter or the transmitter section on low output transmission because no current is substantially caused to flow through the power amplifier 11. This brings about improvement of efficiency in the transmitter or the transmitter section. Moreover, high power transmission can be carried out like in the conventional circuit by putting the power amplifier 11 into the active state together with the drain bias circuit 12' and the gate bias circuit 21.

What is claimed is:

1. A transmission power control circuit having a circuit input terminal and a circuit output terminal and comprising:
    a first transmission circuit which has a first input terminal and a first output terminal;
    a second transmission circuit which has a second input terminal and a second output terminal;
    a circulator which has a first circulator port connected to the first output terminal, a second circulator port connected to the circuit output terminal, and a third circulator port selectively connected by a switch to either the second output terminal or a connection to ground, and which circulator circularly transmits an electric signal from a selected one of the first and the third circulator ports to the second circulator port; and
    a switch circuit which selectively connects the circuit input terminal to the first and the second transmission circuits to selectively supply the electric signal to the first and the third circulator ports.

2. A transmission power control circuit as claimed in claim 1, wherein the first transmission circuit has an output impedance;
    the electric signal being sent from the third circulator port to the second circulator port through the first circulator port in dependency upon the output impedance when the switch circuit selects the second transmission circuit to supply the electric signal to the third circulator port through the second transmission circuit.

3. A transmission power control circuit as claimed in claim 2, wherein the output impedance of the first transmission circuit is substantially infinite and the electric signal is sent from the third circulator port to the second circulator port by being reflected by the first circulator port.

4. A transmission power control circuit as claimed in claim 1, wherein the first transmission circuit comprises:
    a power amplifier which is located between the first input terminal and the first output terminal and which amplifies the electric signal sent through the first input terminal into an amplified signal produced through the first output terminal;
    the switch circuit comprising:
    a first switch coupled to the circuit input terminal to select either one of the first and the second input terminals and to selectively connect the power amplifier and the second transmission circuit; and
    a second switch for selectively connecting the second output terminal to the third circulator port.

5. A transmission power control circuit as claimed in claim 4, wherein the second switch has a first switch terminal connected to a terminator and a second switch terminal connected to the second output terminal;
    the first and the second switch terminals being selectively connected to the third circulator port to select either one of the terminator and the second transmission circuit.

6. A transmission power control circuit as claimed in claim 5, wherein the second transmission circuit is a bypass circuit for bypassing the power amplifier.

7. A transmission power control circuit as claimed in claim 4, wherein the power amplifier includes a field effect transistor (FET) which has a drain electrode, a source electrode, and a gate electrode.

8. A transmission power control circuit as claimed in claim 7, wherein the first transmission circuit further comprises:

a drain bias circuit, connected to a power source and the power amplifier, for selectively supplying a drain bias to the drain electrode of the FET when the power source is coupled to the power amplifier; and a gate bias circuit for controlling a gate bias given to the gate electrode of the FET.

9. A transmission power control circuit as claimed in claim 8, further comprising:

a control circuit, coupled to the first switch, the second switch, the drain bias circuit, and the gate bias circuit, for selectively connecting either one of the power amplifier and the bypass circuit to the circulator by controlling the first and the second switches, the drain bias circuit, and the gate bias circuit.

10. A transmission power control circuit as claimed in claim 9, wherein the control circuit controls the drain bias circuit to put the drain bias circuit into an off state and to thereby disconnect the power amplifier from the power source when the bypass circuit is connected to the circulator.

11. A transmission power control circuit as claimed in claim 10, wherein the control circuit delivers a switch control signal to the first and the second switches with reference to a transmission level of a circuit output signal sent through the circuit output terminal.

12. A transmission power control circuit as claimed in claim 11, wherein the control circuit produces the switch control signal to connect the bypass circuit to the circulator through the first and the second switch when the transmission level is lower than a predetermined level and, otherwise, to connect the power amplifier to the circulator through the first switch.

13. A transmission power control circuit as claimed in claim 12, further comprising:

a pre-amplifier, located between the circuit input terminal and the first switch, for amplifying an input signal into a pre-amplified signal sent to the first switch.

14. A transmission power control circuit as claimed in claim 13, wherein the pre-amplified signal is transmitted through the bypass circuit to the circuit output terminal without being amplified by the power amplifier when the power amplifier is separated by the first switch from the pre-amplifier and is put into the off state under control of the controller.

15. A transmission power control circuit as claimed in claim 14, wherein the pre-amplified signal is amplified by the power amplifier into an amplified signal when the power amplifier is selected by the first switch and is put into an on state under control of the control circuit.

16. A transmission power control circuit as claimed in claim 8, wherein the gate bias circuit is operable in response to a digital signal which is representative of a transmission level and which is given from the control circuit, the gate bias circuit comprising:

a digital-to-analog (D/A) converter for converting the digital signal into an analog signal corresponding to the transmission level; and an inverting amplifier which is connected to the power source and which is operable in response to the analog signal to supply the gate bias to the gate electrode of the FET included in the power amplifier.

17. A transmission power control circuit as claimed in claim 16, wherein the gate bias circuit further comprises:

a negative voltage generating circuit, connected to the inverting amplifier, for supplying a negative voltage to the inverting amplifier.

18. A transmission power control circuit as claimed in claim 5, wherein the terminator has an impedance determined by a characteristic impedance concerned with a transmission path including the power amplifier.

19. A transmission power control circuit as claimed in claim 6, wherein the bypass circuit is a short-circuit.

20. A transmission power control circuit operable in response to an input transmission signal to produce an output signal, comprising:

a power amplification circuit for amplifying the input transmission signal into an amplified signal;

a bypass circuit for bypassing the input transmission signal to produce a non-amplified signal;

a selection circuit for selecting either one of the amplified signal and the non-amplified signal to produce the output signal which has a gain varied over a widened range; and a circulator which has first, second, and third circulator ports to circulate the amplified signal and the non-amplified signal from the first and the third circulator ports, respectively, to the second circulator port to produce the output signal, and a switch for selectively connecting the third circulator port to either an output of the bypass circuit or a connection to ground.

21. A transmission power control circuit as claimed in claim 20, further comprising:

a circulator which has first, second, and third circulator ports to circulate the amplified signal and the non-amplified signal from the first and the third circulator ports, respectively, to the second circulator port to produce the output signal.

22. A transmission power control circuit as claimed in claim 21, wherein the non-amplified signal is subjected to reflection at the first circulator port and is thereafter circulated to the second circulator port.

23. A method of controlling electric power of an output transmission signal produced in response to an input transmission signal, comprising:

preparing a circulator which has a first circulator port, a second circulator port, and a third circulator port;

connecting, to the first circulator port, an amplifier which has an output impedance and which produces an amplified signal in response to the input transmission signal;

selectively connecting the third circulator port to either a bypass circuit which has an impedance lower than the output impedance of the amplifier or to a connection to ground;

selectively supplying the input transmission signal through the bypass circuit to the circulator to circulate the input transmission signal from the third circulator port to the second circulator port through the first circulator port, to thereby cause reflection of the input transmission signal to occur at the first circulator port, and to produce a circulated signal as the output transmission signal.

* * * * *

UNITED STATES PATENT AND TRADEMARK OFFICE
CERTIFICATE OF CORRECTION

PATENT NO.    : 6,169,449 B1  
DATED         : January 2, 2001  
INVENTOR(S)   : Osamu Hasegawa Page 1 of 1

It is certified that error appears in the above-identified patent and that said Letters Patent is hereby corrected as shown below:

<u>Title page,</u>
Item [56], References Cited, FOREIGN PATENT DOCUMENTS, insert:
--     9-148852     6/6/1997     (JP)  
       7-99457     4/11/1995     (JP)  
       60-132019     9/4/1985     (JP)  
       10-327082     12/8/1998     (JP)

<u>Column 1,</u>
Line 31, "control" should read -- controlling --

Signed and Sealed this

Fifth Day of February, 2002

*Attest:*

*Attesting Officer*

JAMES E. ROGAN  
*Director of the United States Patent and Trademark Office*